United States Patent
Iijima et al.

(10) Patent No.: US 8,198,797 B2
(45) Date of Patent: Jun. 12, 2012

(54) METHOD OF CONTROLLING ELECTRON BEAM FOCUSING OF PIERCE-TYPE ELECTRON GUN AND CONTROL APPARATUS THEREFOR

(75) Inventors: Eiichi Iijima, Chigasaki (JP); Guo Hua Shen, Chigasaki (JP); Tohru Satake, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 452 days.

(21) Appl. No.: 12/446,584

(22) PCT Filed: Oct. 18, 2007

(86) PCT No.: PCT/JP2007/070352
§ 371 (c)(1),
(2), (4) Date: May 5, 2009

(87) PCT Pub. No.: WO2008/050670
PCT Pub. Date: May 2, 2008

(65) Prior Publication Data
US 2010/0026161 A1 Feb. 4, 2010

(30) Foreign Application Priority Data
Oct. 23, 2006 (JP) ................................. 2006-287658

(51) Int. Cl.
*H01J 29/46* (2006.01)
(52) U.S. Cl. ..................................................... 313/441
(58) Field of Classification Search .......... 313/412–414, 313/441–460
See application file for complete search history.

(56) References Cited

U.S. PATENT DOCUMENTS

| | | | | |
|---|---|---|---|---|
| 3,602,765 A | * | 8/1971 | Rath et al. ...................... | 315/382 |
| 3,651,360 A | * | 3/1972 | Sommeria ...................... | 313/454 |
| 4,186,305 A | * | 1/1980 | Taoka et al. ................... | 250/311 |

FOREIGN PATENT DOCUMENTS

| | | |
|---|---|---|
| JP | 07258832 A | 10/1995 |
| JP | 2003346671 A | 12/2003 |
| JP | 200414226 A | 1/2004 |
| JP | 2004315971 A | 11/2004 |
| JP | 2005264204 A | 9/2005 |
| JP | 2005268177 A | 9/2005 |

* cited by examiner

*Primary Examiner* — Joseph L Williams
*Assistant Examiner* — Brenitra Lee
(74) *Attorney, Agent, or Firm* — Harness, Dickey & Pierce, PLC

(57) ABSTRACT

[Object] In the control of electron beam focusing of a pierce-type electron gun, any influences from the space charge effect and space charge neutralizing action within the electron gun are eliminated to attain complete control of an electron beam. [Solving Means] Feedback control of the pressure within the electron gun is performed by directly measuring temperature at an internal of the pierce-type electron gun. It is desirable that locations where the direct measurement of the temperature at the internal of the electron gun is performed are an anode (39) and a flow register (43). Further, the direct measurement can be performed at any one of a ring, an aperture and an exhaust pipe provided at an outlet or an inlet of any one of a cathode chamber (31), an intermediate chamber, and a scanning chamber (33). Accordingly, all of stabilization of beam producing area (optimized design of electron gun itself), stabilization of beam transporting portion and stabilization of beam using portion have become appropriate.

10 Claims, 15 Drawing Sheets

METHOD OF CONTROLLING ELECTRON BEAM FOCUSING OF PIERCE-TYPE ELECTRON GUN AND CONTROL APPARATUS THEREFOR

FIELD

The present invention relates to a method of controlling of a pierce-type electron gun that is capable of maintaining a stable electron beam for a long period of time, a control apparatus to control the electron beam of the pierce-type electron gun, and a vacuum apparatus provided therewith.

BACKGROUND

A pierce-type electron gun has a characteristic of being able to separate a beam generation source and a vacuum atmosphere including an irradiation target and able to maintain a stable beam generation source. Further, the pierce-type electron gun is widely used as a heating source for a vapor deposition apparatus, a melting furnace and a heat-treating furnace because the pierce-type electron gun uses electrons as an energy source, and is capable of easily scanning and deflecting. The application field of the pierce-type electron gun is expected to become broader and broader in the future, especially as a heating source of an in-line vapor deposition apparatus for metal oxide such as MgO and $SiO_2$ in which long-time stability over 300 hours or more is required, as a heating source of a roll-to-roll vapor deposition apparatus that is capable of heating to a predetermined evaporation rate in a short time, in which it is required to evaporate, stably and at a large capacity, metal such as Al, Co—Ni and Cu in an excellent deposition thickness distribution, as a heating source of a roll-to-roll vapor deposition apparatus for optical layers in which metal oxide layers of $SiO_2$, ZrO and the like are reproducibly evaporated in a deposition thickness distribution within ±1%, and the like (examples of use of the electron gun in the MgO vapor deposition apparatus and the roll-to-roll vapor deposition apparatus are shown in FIGS. 9 and 10, respectively).

Especially, in recent years, in order to deal with trends of increase in size of a mother glass and commercial production, there has been a demand for more homogenous and high-speed deposition of a magnesium oxide (MgO) layer which is used as a protective layer for a surface of a grass substrate for a plasma display panel (PDP).

Because of such background, an electron beam vapor deposition apparatus including a plurality of pierce-type electron guns (FIG. 15) has been developed, for example. This apparatus basically has a structure as shown as electron beam apparatuses 81, 82, in each of which two chambers of a loading/unloading chamber and a vapor deposition chamber or three chambers of a loading chamber, a vapor deposition chamber, and a unloading chamber are connected via a gate valve.

The outline of the vapor deposition chamber 2 in the electron beam vapor deposition apparatuses 81, 82 is as shown in FIG. 9. That is, as a heating source for continuously forming MgO as a protective layer for the PDP, a pierce-type electron gun 3 is mainly used. An electron beam F approximately horizontally emitted from the pierce-type electron gun that is fixed to a side wall of the vapor deposition chamber is deflected by an electron beam deflection device 20 and focused on an evaporation point P of MgO 11 in a hearth 4 as an evaporation source, to thereby generate an MgO vapor flow and form an MgO layer on a glass substrate 10 mounted on a carrier that passes and moves thereabove. That is, the vapor deposition chamber doubles as an irradiation chamber of the electron beam.

The electron beam vapor deposition apparatuses 81, 82 have features that the vapor deposition chamber is prevented from being exposed to the atmosphere, and an atmosphere in the vapor deposition chamber can be stably maintained because a pretreatment such as degassing and heating treatments can be performed with respect to the glass substrate 10 or a carrier mounted with the glass substrate in the loading/unloading chamber 83 or the loading chamber 84, and that the production volume is large as compared with a batch-type apparatus.

However, there is a desire for a stable operation of the pierce-type electron gun for a long period of time.

In this regard, from the past, there has been made various kinds of efforts for the stable operation of the pierce-type electron gun for a long period of time.

For example, there is a case where moisture, residual gas, evaporating particles and the like exist within the vapor deposition chamber, and thermal electrons which constitute the electron beam collide therewith to thereby generate ions, and the ions flow back to cause an abnormal electrical discharge of the electron gun. Thus, a cathode is provided with a through-hole and an ion collector for receiving ions and components that are dispersed by the collision of the ions (for example, see Patent Documents 1, 2).

However, a diameter of the electron beam at an internal of the electron gun and a diameter (power density) of the electron beam which is irradiated on a target fluctuate depending on pressure at the internal of the electron gun and pressure at an atmosphere in which the irradiation target is placed, because of a space charge effect that increases the beam diameter and an energy width due to an interaction between particles which is caused by charges included in electrons, and because of a space charge neutralizing action due to ionization of an atmosphere gas caused by collision of the electrons with the gas. Accordingly, when taking vapor deposition as an example, there has been a problem that a vapor deposition rate lacks stability, and the like. Therefore, there has been a case where a stable operation in a wide area by separating a beam generation source and an atmosphere including an irradiation target, which is one of characteristics of the pierce-type electron gun, cannot be fully utilized.

Moreover, expansion of the beam at the internal of the electron gun may affect and overheat components within the electron gun. As a result, there has been a case where the electron gun itself is damaged.

In this regard, in order to stabilize the beam diameter at the internal of the electron gun, that is, to prevent the beam from expanding widely and avoid the electron gun from being damaged, means have been used such as introducing Ar into the electron gun as a space charge neutralizing gas, adjusting a conductance of a flow register, and providing multiple stages of focusing coils.

Further, an electron beam emitter portion (beam generation portion, generation portion) is stabilized with respect to assembling accuracy and change according to time. In other words, the electron gun itself is optimumly designed such that an angle of a cathode surface, an angle of a Wehnelt, an angle of an anode, a gap between the cathode and the Wehnelt, a gap between the cathode and anode, and the like comply with the above object. This is performed with the aim of stabilizing a beam focusing condition that depends on an electric field.

However, in both cases, there is no appropriate feedback means, and the electron gun is operated with preset values.

Thus, it has been difficult to perform a stable and accurate deposition process. Further, an inert gas such as Ar may also affect the deposition process.

In this regard, a method has been proposed in which a beam diameter is measured at a beam outlet and a beam irradiation portion and fed back to a beam current and a focusing coil current (see Patent Document 3). As shown in FIG. 14, monitor pieces XR 1, XR 2, XR 3, XL 1, XL 2, XL 3, which are capable of outputting a beam point temperature of the electron beam as an electric signal, are provided in a vicinity of a ring hearth 4 as the beam irradiation portion to feedback the beam point temperature to the beam current and the focusing coil current to thereby achieve stabilization.

However, there remains an influence of the space charge effect in the internal of the electron gun. Thus, it is less than perfect.

Patent Document 1: Japanese Patent Application Laid-open No. 2004-14226 (page 3, FIG. 1)
Patent Document 2: Japanese Patent Application Laid-open No. 2005-268177 (page 3, FIG. 1)
Patent Document 3: Japanese Patent Application Laid-open No. 2005-264204 (page 3, FIG. 1)

SUMMARY

Problems to be Solved by the Invention

The present invention has been made in view of the above-mentioned problems, and it is an object of the present invention to eliminate any influences from the space charge effect and space charge neutralizing action within the electron gun and to attain complete control of the electron beam.

Means for Solving the Problems

As described above, a beam at an internal of an electron gun is affected by a space charge effect. Expansion of the electron beam and a tendency of beam energy are as shown in FIG. 11. The expansion of the beam at the internal of the electron gun affects and overheats components within the electron gun. Thus, a focusing state of the electron beam, which fluctuates within the electron gun due to influences of the space charge effect and the space charge neutralizing action, is made constant by measuring temperature at the internal of the electron gun and feeding back the temperature to an exhaust rate of a vacuum exhaust system to adjust pressure at the internal of the electron gun.

In other words, the above problem is solved by a method of directly measuring temperature at an internal of an electron gun, and controlling a pierce-type electron gun in accordance with the measured temperature.

Further, the above problem is solved by an apparatus for controlling a pierce-type electron gun, including means for performing direct measurement of temperature at an internal of an electron gun.

It should be noted that, when taking into account beam stability with respect to an object, it is desirable, in an electron gun having two or more focusing coils, to make the beam that enters from a first focusing coil to a second focusing coil parallel as long as possible. This control is performed by adjusting the pressure at the internal of the electron gun. Of course, since the focusing coil is a lens, the beam is adjusted from substantially parallel state to somewhat diffused state.

Effect of the Invention

In order to improve performance of a PDP, product yield, and product stability, it is required to maintain a stable deposition thickness distribution in a glass substrate for a long time period. It becomes possible to cope with this. Specifically, a conventional continuous operating time for a mother glass which can be cut out into two 42-inch substrates is 144 hours (about one week) at 8000 Å±10%, but a continuous operation over 240 hours (about ten days) at 8000 Å±5% for the same size becomes possible. Moreover, a continuous operating time over two weeks or more at 8000 Å±7% for a panel which can be cut out into six to eight 42-inch substrates becomes possible. Further, conventionally, the beam diameter at the internal of the electron gun is roughly measured by visual inspection to adjust the focusing coils and an inert gas such as Ar. However, by measuring temperature, it is possible to reproducibly adjust them.

Further, by monitoring the temperature at the internal of the electron gun, it is possible to prevent the electron gun from being damaged, and this is applicable to prevention and early detection of product defects, which are conventionally difficult to detect. Conventionally, a normal state is determined by an electrical interlocking if the electron beam is output and a predetermined electric current flows through the focusing coil and scanning coil.

Further, in an in-line vapor deposition apparatus that continuously operates an electron gun for a long period of time, there are cases where pressure in a vapor deposition chamber is controlled to be constant to perform production, and where a process gas flow is made to be constant to perform production. In the latter case, if a carry-in flow of a gas from outside fluctuates, the vapor deposition rate fluctuates. In this case, if the vapor deposition material is other than MgO, for example, metal deposition, it is possible to perform feedback to power, beam focus, and a scan system of the electron gun by using a reliable deposition rate measuring means such as a crystal-oscillation type deposition controller. However, in the case of metal oxide, there is no means for measuring a deposition rate over a long period of time. However, by using the means developed this time, it becomes possible to provide an efficient control means even for the pressure fluctuation of the irradiation chamber.

With the above structure, it becomes possible to deal with all of stabilization of a beam producing portion (optimized design of the electron gun itself), stabilization of a beam-transporting portion (the method according to the present invention), and stabilization of a beam use portion (a method of Patent Document 3).

BRIEF DESCRIPTION OF DRAWINGS

FIG. 11A shows a state of a magnetic field generated by the focusing coil. FIG. 11B shows the diameter of the electron beam. As a degree of the space charge effect increases, the beam diameter becomes larger.

Monitor pieces XR 1, XR 2, XR 3, XL 1, XL 2, XL 3 are provided in a vicinity of the ring hearth 4, to perform feedback to the beam current and/or a focusing coil current for stabilization. It should be noted that a single pierce-type electron gun 3 performs jumping control by using the electron beam to alternately heat irradiation points PR1, PR2 on a material contained in a groove portion 4a on the ring hearth. In the figure, a solid line indicates one part of the jumping control, and a dotted line indicates the other part of the jumping control.

Figure 15:
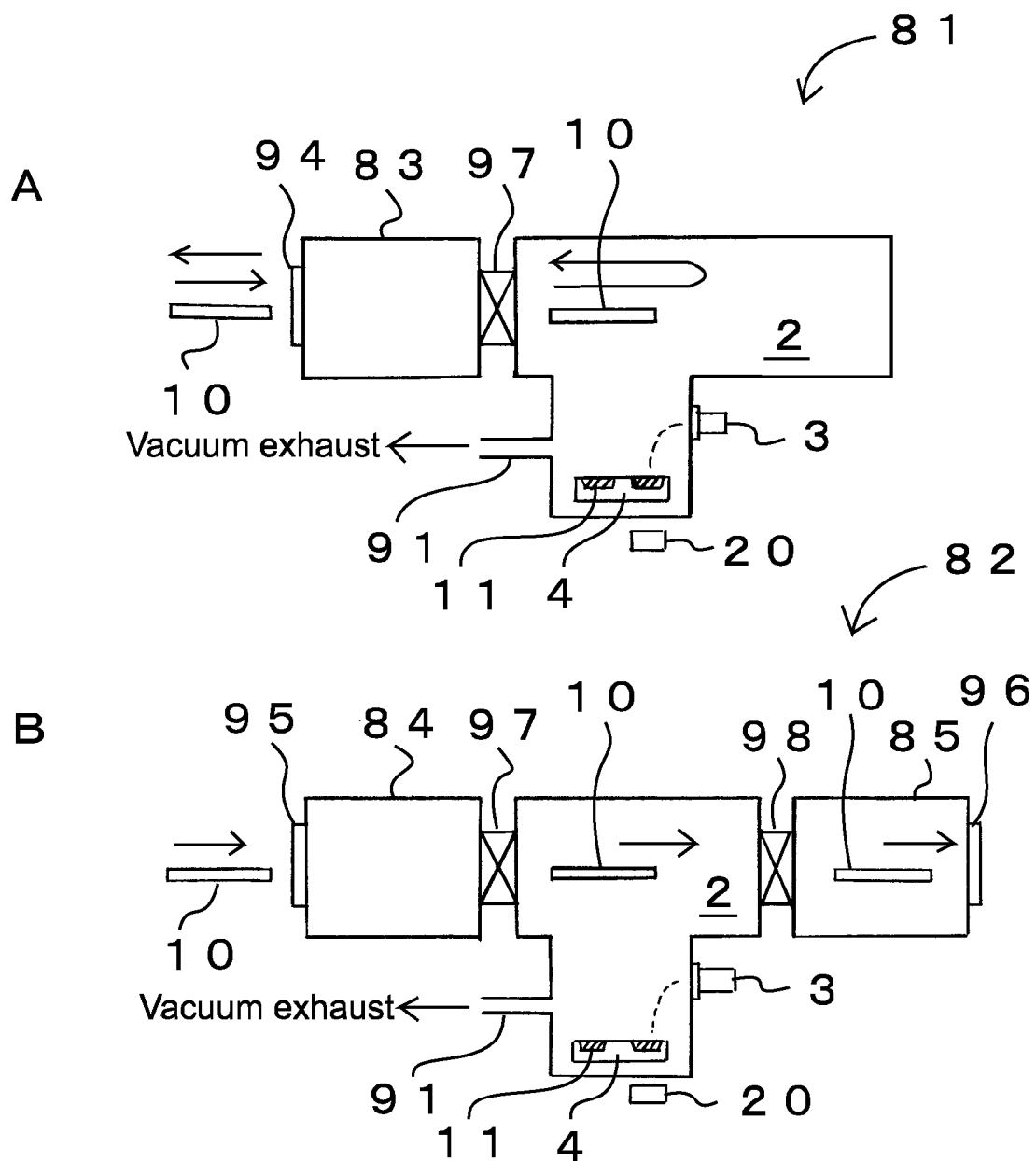

FIG. 15 are schematic diagrams of the electron beam vapor deposition apparatus. FIG. 15A shows a case of two chambers, and FIG. 15B shows a case of three chambers.

DETAILED DESCRIPTION

Figure 1:
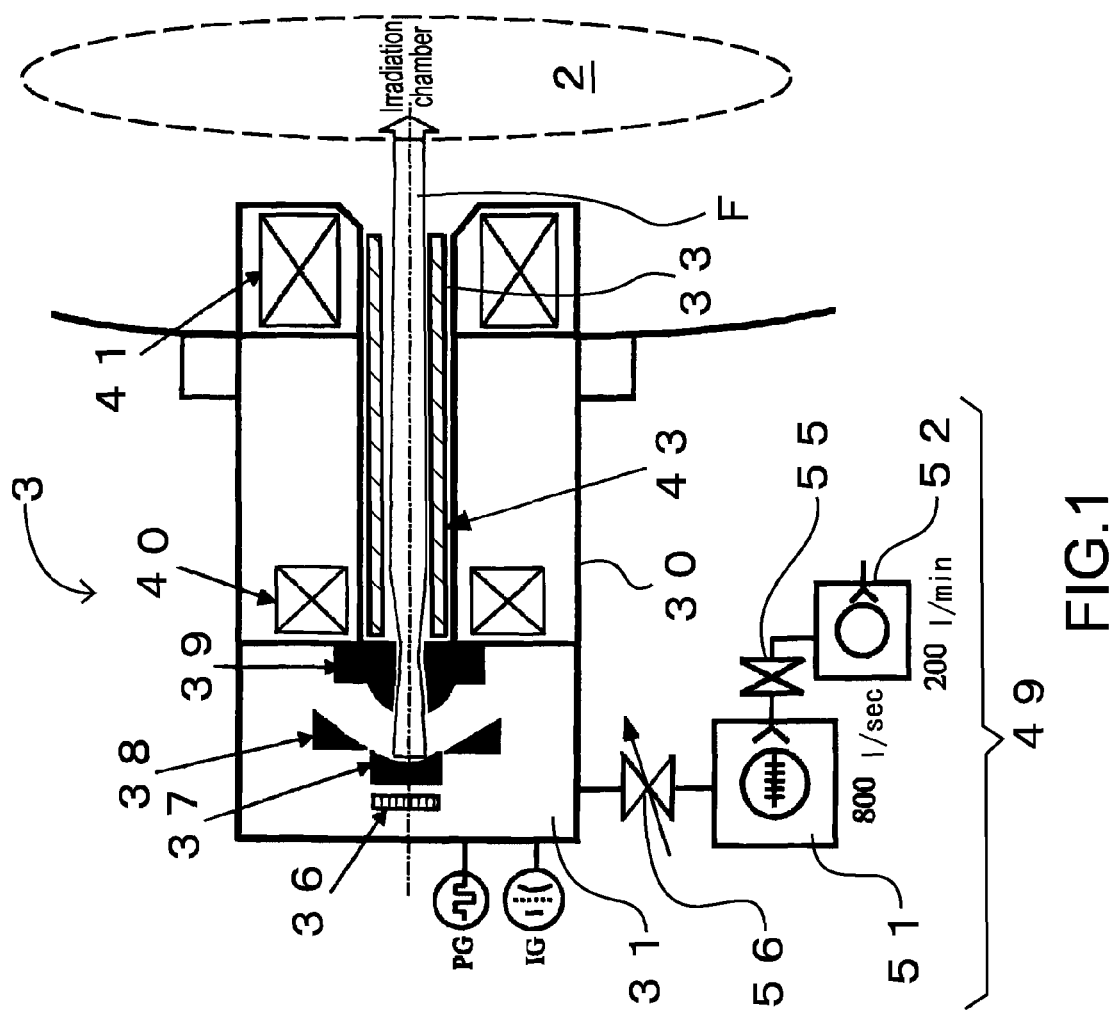
FIG. 1 is a diagram of a vacuum exhaust system of an electron gun according to an embodiment of the present invention.
Figure 2:
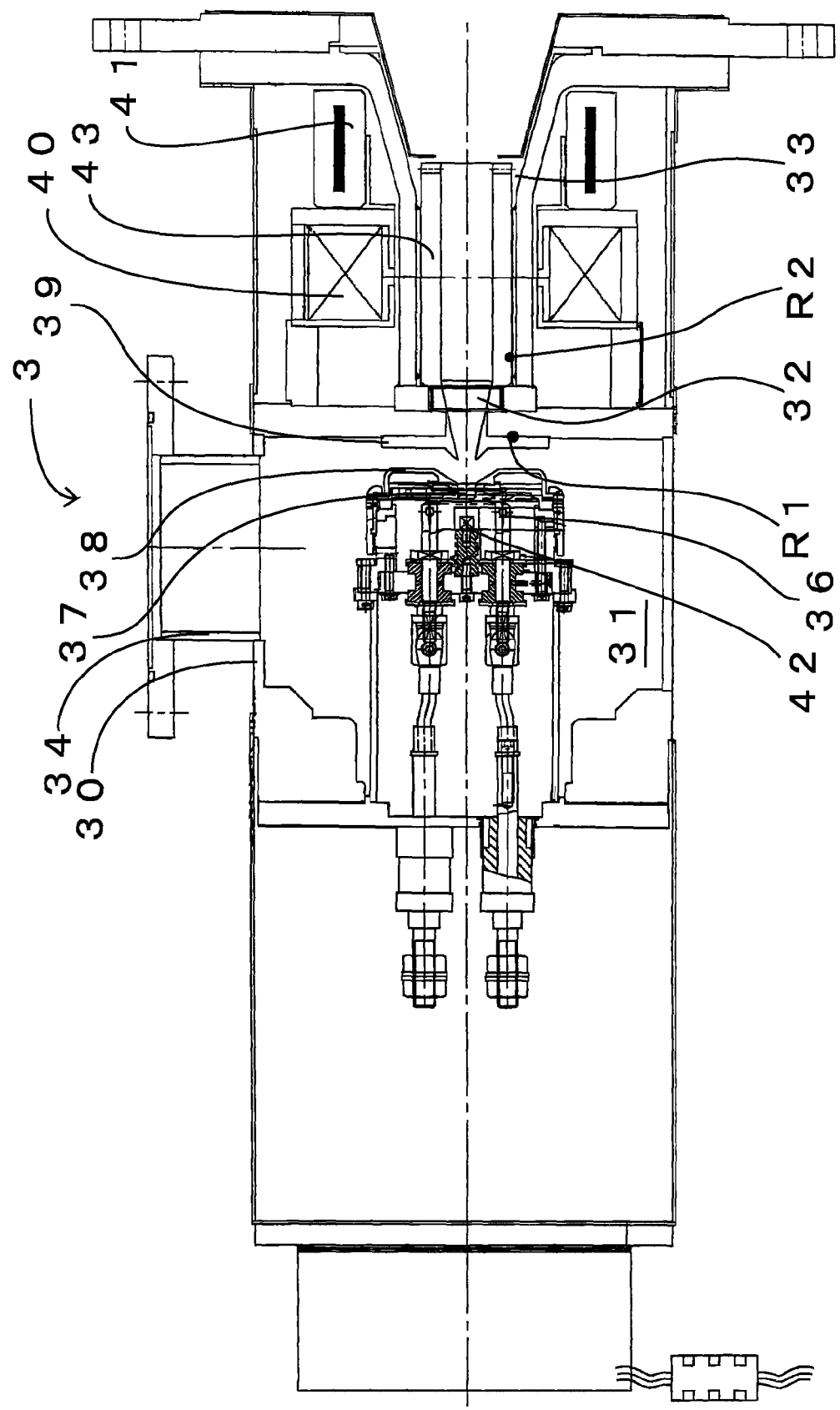
FIG. 2 is a first embodiment of the present invention shown as a cross-sectional view of a 30 kW pierce-type electron gun. Installation positions of thermocouples R1, R2 are shown.
Figure 3:
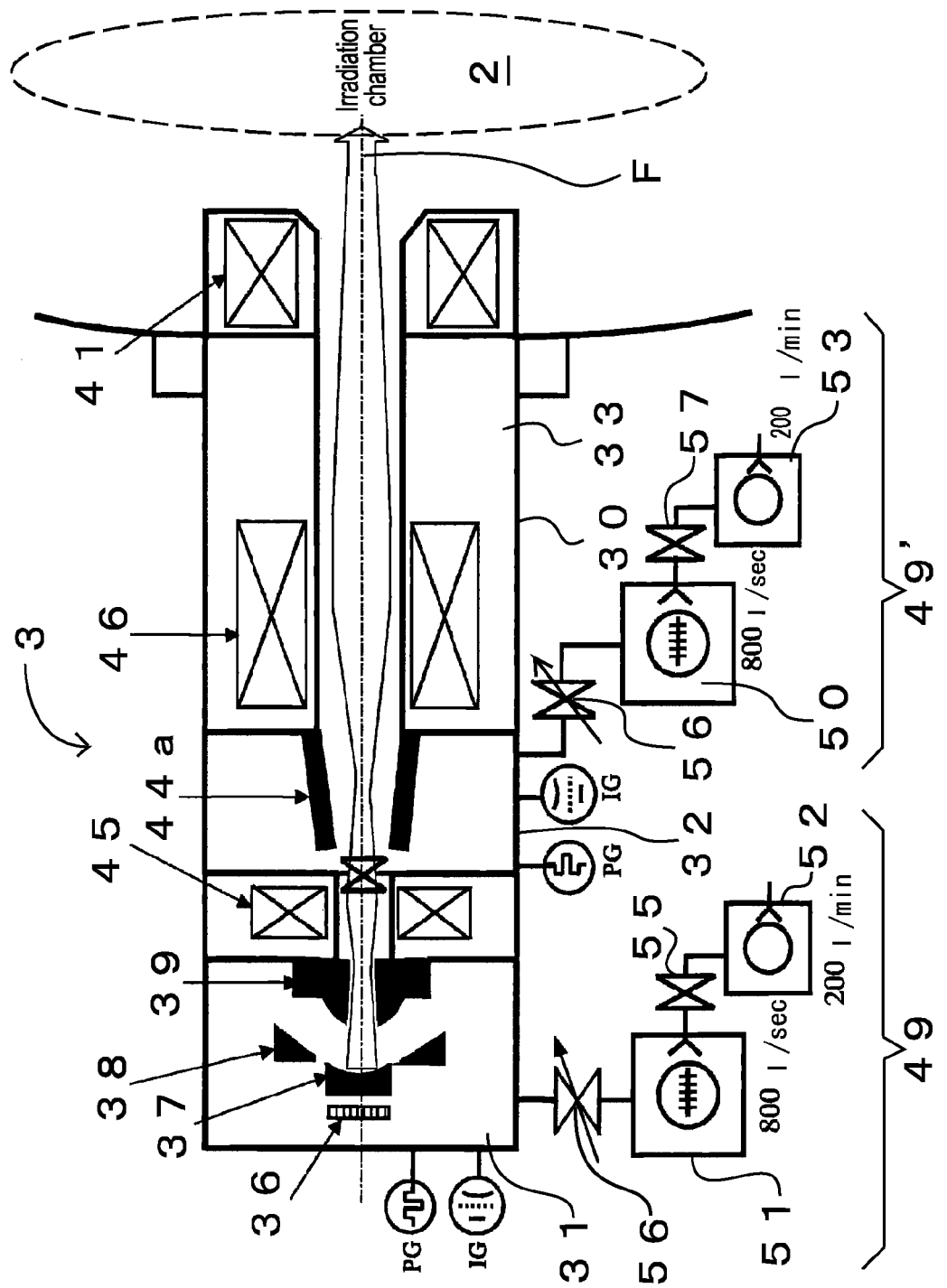
FIG. 3 is a diagram of a vacuum exhaust system of a 100 kW pierce-type electron gun according to embodiment 2 of the present invention. It should be noted that, in this embodiment, a differential exhaust hole is provided with a differential exhaust pipe.
Figure 4:
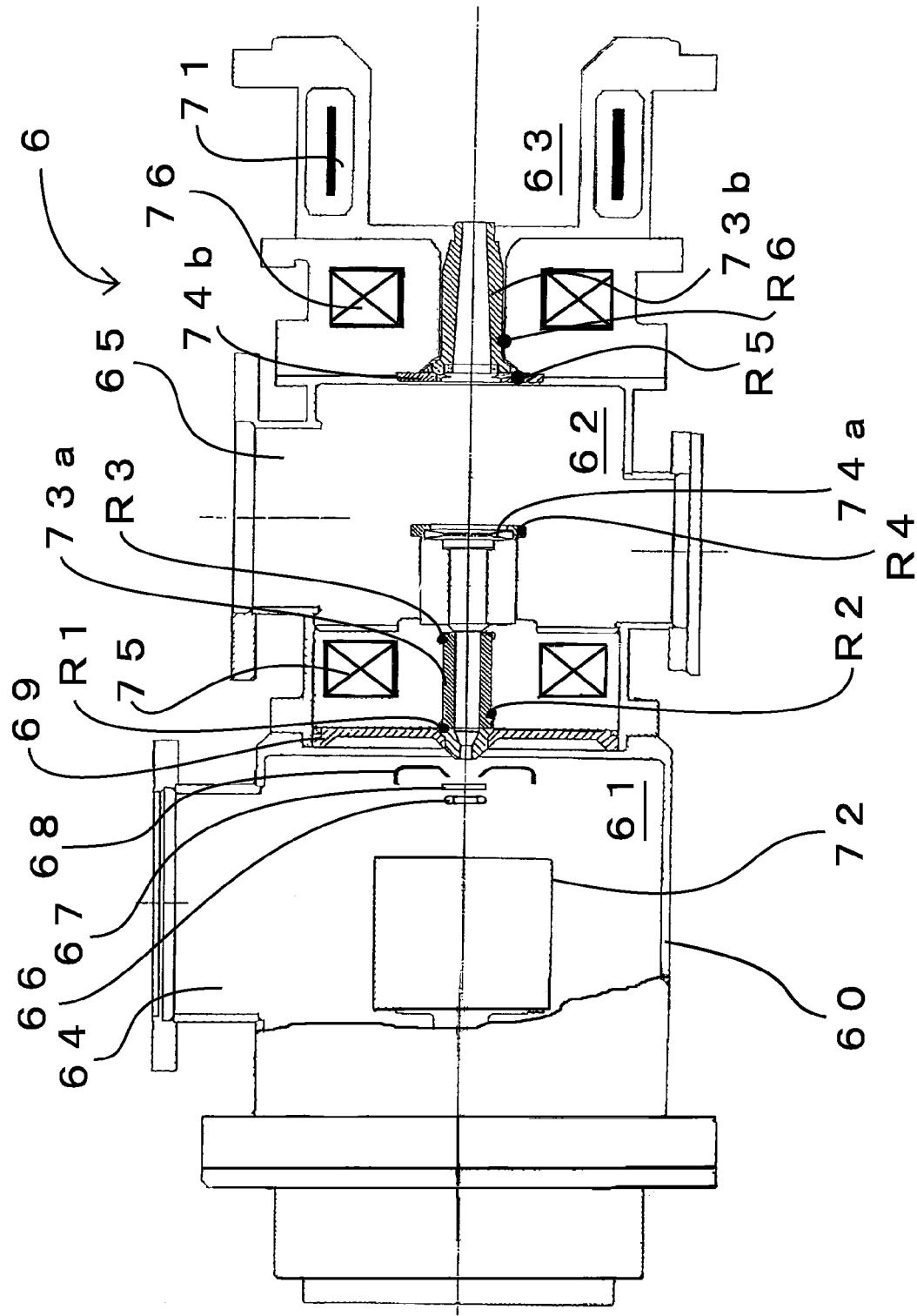
FIG. 4 is a cross-sectional view of the 100 kW pierce-type electron gun according to the embodiment 2 of the present invention. Installation positions of thermocouples R1 to R6 are shown.
Figure 5:
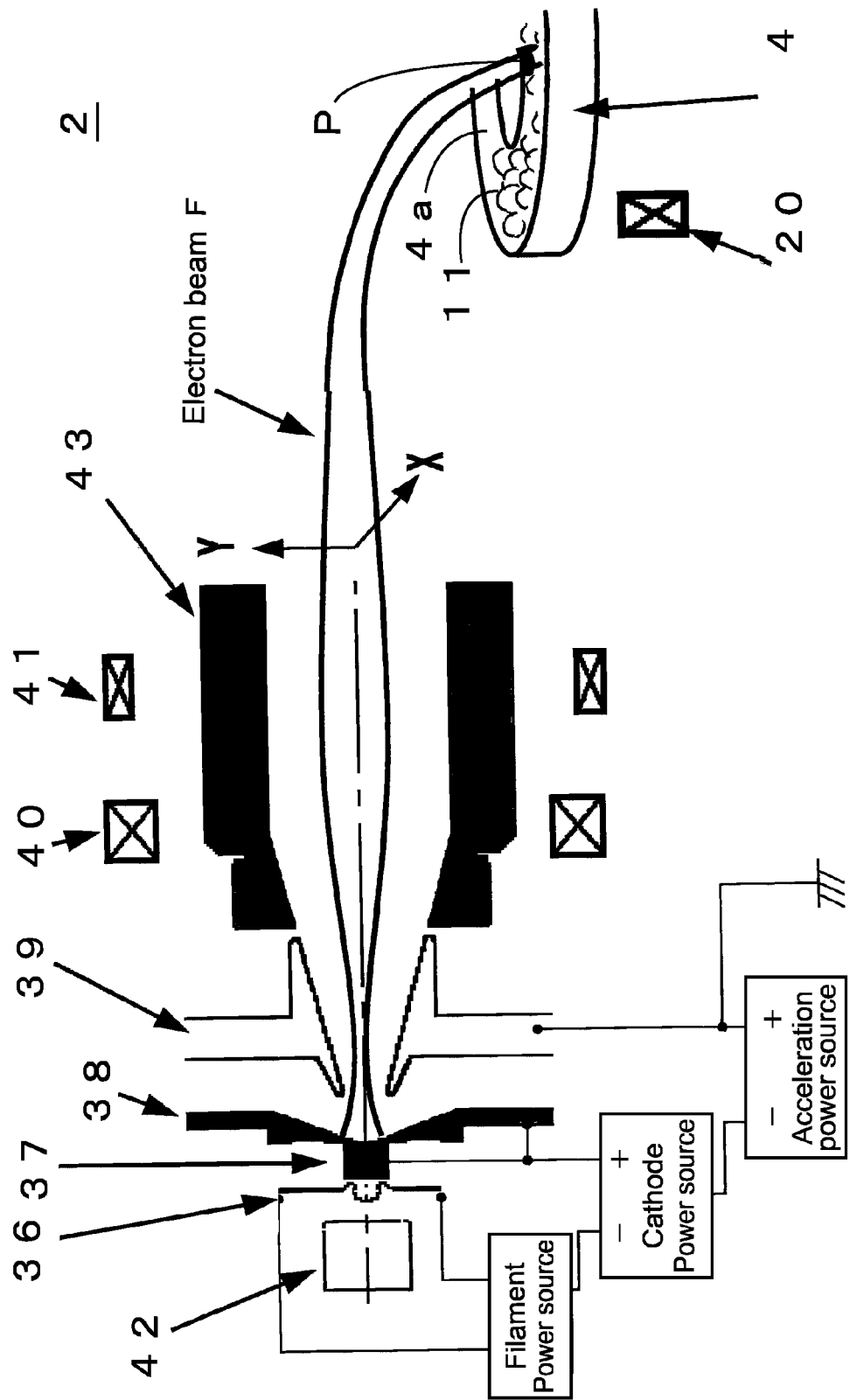
FIG. 5 is a principle diagram of the pierce-type electron gun. A principle of electron beam emission is shown. Thermoelectrons are emitted from a heated cathode 37, and extraction and focusing of the electrons are performed by using an electric field formed by the cathode 37 and a Wehnelt 38, and an anode 39. Therefore, dimensions and locations of the cathode 37, the Wehnelt 38, and the anode 39 are important for beam formation. An electron beam that has passed through the anode 39 is controlled by a focusing coil 40, scanning coil 41, and an electron beam deflection apparatus 20 such that the electron beam does not diffuse, and is irradiated onto a material 11 on a requisite hearth 4.

Hereinafter, a specific embodiment to which the present invention is applied will be described in detail with reference to the drawings. FIG. 1 shows a diagram of a vacuum exhaust system of a 30 kW pierce-type electron gun according to an embodiment of present invention. FIG. 2 shows a cross-sectional view of the 30 kW pierce-type electron gun. FIG. 3 shows diagram of a vacuum system of a 100 kW pierce-type electron gun. FIG. 4 shows a cross-sectional view of the 100 kW pierce-type electron gun. FIG. 5 shows a principle diagram of the pierce-type electron gun.

Using FIGS. 1 and 5, a description will be given on a representative structure and functions of respective components of a 30 kW pierce-type electron gun 3. Major components of the 30 kW pierce-type electron gun are a filament 36, a cathode 37, a Wehnelt 38, an anode 39, a focusing coil 40, a scanning coil 41, an ion collector 42 (FIG. 5), a flow register 43, a body (casing) 30, and a vacuum exhaust system 49 (FIG. 1). Respective functions are as follows.

As shown in FIG. 5, the filament 36 passes an alternating current and generates Joule heat to emit thermoelectrons. By receiving the electrons that are generated and accelerated in the filament 36 by applying a positive voltage to the filament 36, the cathode 37 is heated and emits the thermoelectrons. The Wehnelt 38 is also referred to as a focus electrode, has the same potential as the cathode 37, and forms an electric field between the Wehnelt 38 and the anode 39 in which the electrons move toward a center of the anode 39 to generate the electron beam efficiently. The anode 39 has a positive potential with respect to the cathode 37, and accelerates the thermoelectrons generated in the cathode 37. Because the anode 39 is usually connected to a ground potential, the cathode 37 is applied with a negative voltage. The electron beam passes through a hole in the center.

The focusing coil 40 may be referred to as a focusing lens or simply a lens. The electron beam F that has passed through the anode 39 is focused onto a material 11 of a hearth 4 by a generated magnetic field. Ions generated by collision with the electron beam F and the like are accelerated by voltages of the anode 39 and the cathode 37, and spatter across the cathode 37 to form a hole. When the hole penetrates the cathode 37 due to a prolonged use, the ion collector 42 receives the ion beam to prevent the electron gun body from being damaged. The flow register 43 makes a conductance small to keep pressure in the cathode chamber (beam generation portion) 31 low.

Further, as shown in FIGS. 3 and 4, a pierce-type electron gun having a normal output of 60 kW or more includes, in addition to above, second focusing coils 46, 76, a second flow register 73b (FIG. 4) and a differential vacuum exhaust system 49' (FIG. 3). This is mainly because of a reason as follows. As an electron emission source of a general pierce-type electron gun, an indirect-heating-type cathode made of tungsten is used. A thermoelectron emission amount from a cathode surface per unit area depends on temperature. On the other hand, there is a limit for the highest use temperature because the pierce-type electron gun is used in vacuum. Thus, a cathode having a large diameter is required in order to obtain a large beam current. Accordingly, a diameter of the anode and a diameter of the flow register become larger. Thus, conductance becomes larger, and a second exhaust system is required in order to secure a differential pressure with respect to an irradiation chamber.

(Embodiment 1)

Figure 6:
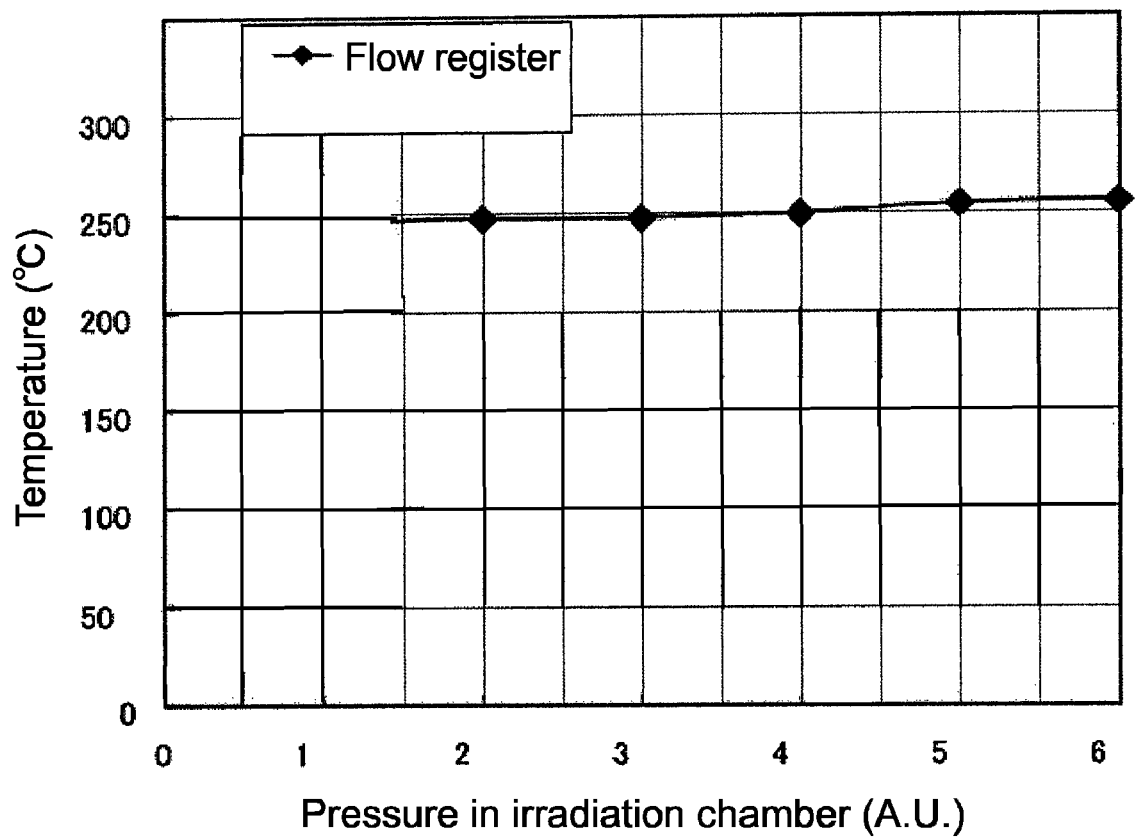
FIG. 6 is a graph of pressure in an irradiation chamber and temperature of a flow register according to the present invention. It can be seen that, when control of a rotation speed of a turbo molecular pump 51 (FIG. 1) is performed, a beam focusing state and the temperature of the flow register 43 are constant, even if the pressure in the irradiation chamber changes.
Figure 7:
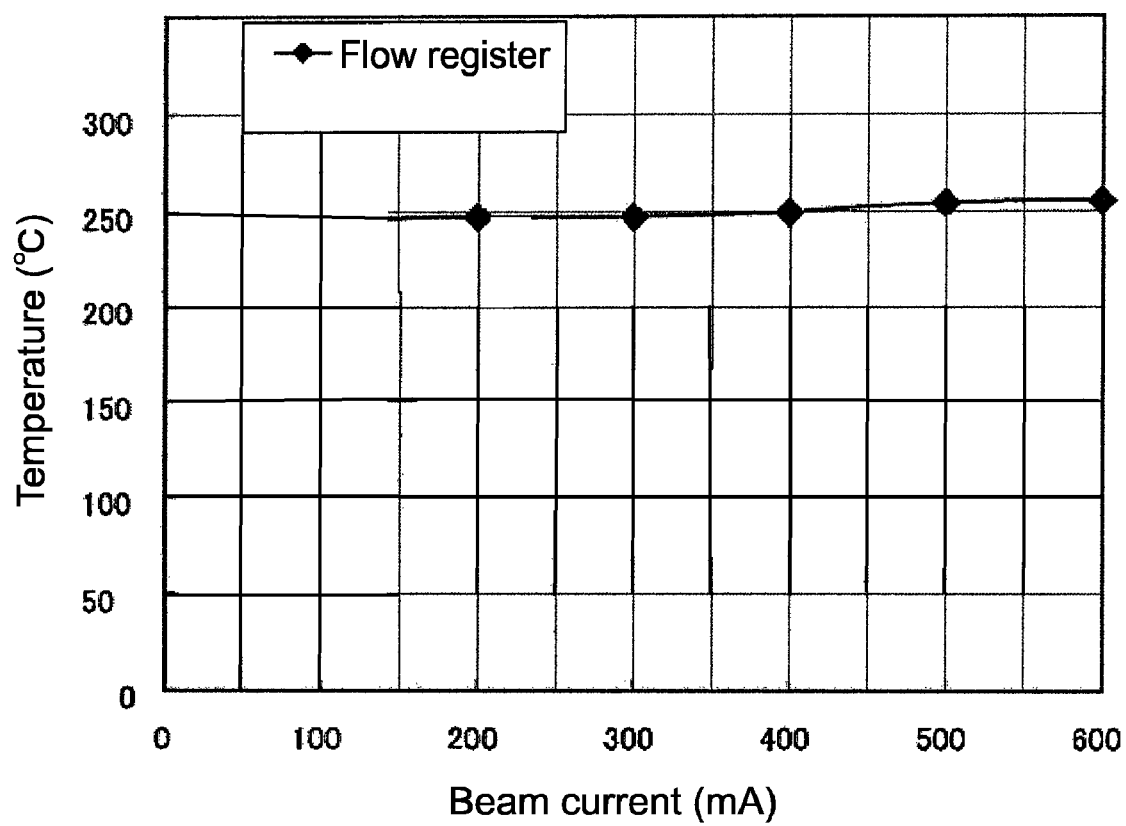
FIG. 7 is a graph of a beam current and the temperature of the flow register according to the present invention. When control of the rotation speed of the turbo molecular pump 51 (FIG. 1) is performed, the beam focusing state is constant and the temperature of the flow register is almost constant, even if the beam current changes.

First, a description will be given on an embodiment of the 30 kW pierce-type electron gun. As shown in FIG. 2, thermocouples R1, R2 are directly mounted to the anode 39 of the cathode chamber 31 and the flow register 43 of the scanning chamber 32. Further, as shown in FIG. 1, a turbo molecular pump 51 whose exhaust rate is 800 liter/sec is mounted to the vacuum exhaust system 49 via a gate valve 56. As the turbo molecular pump 51, a pump that is capable of rotation speed control (controlling a rotation speed to change the exhaust rate) is used. In the embodiment, the temperature of the flow register 43 obtained at the thermocouple R2 of FIG. 2 is fed back to the rotation speed of the turbo molecular pump 51. FIGS. 6 and 7 show a result. It can be seen that a beam focusing state and the temperature of the flow register 43 remain constant even if pressure on the irradiation chamber 2 side changes (FIG. 6). Further, the beam focusing state and the temperature of the flow register 43 is constant even if a beam current changes (FIG. 7).

Figure 8:
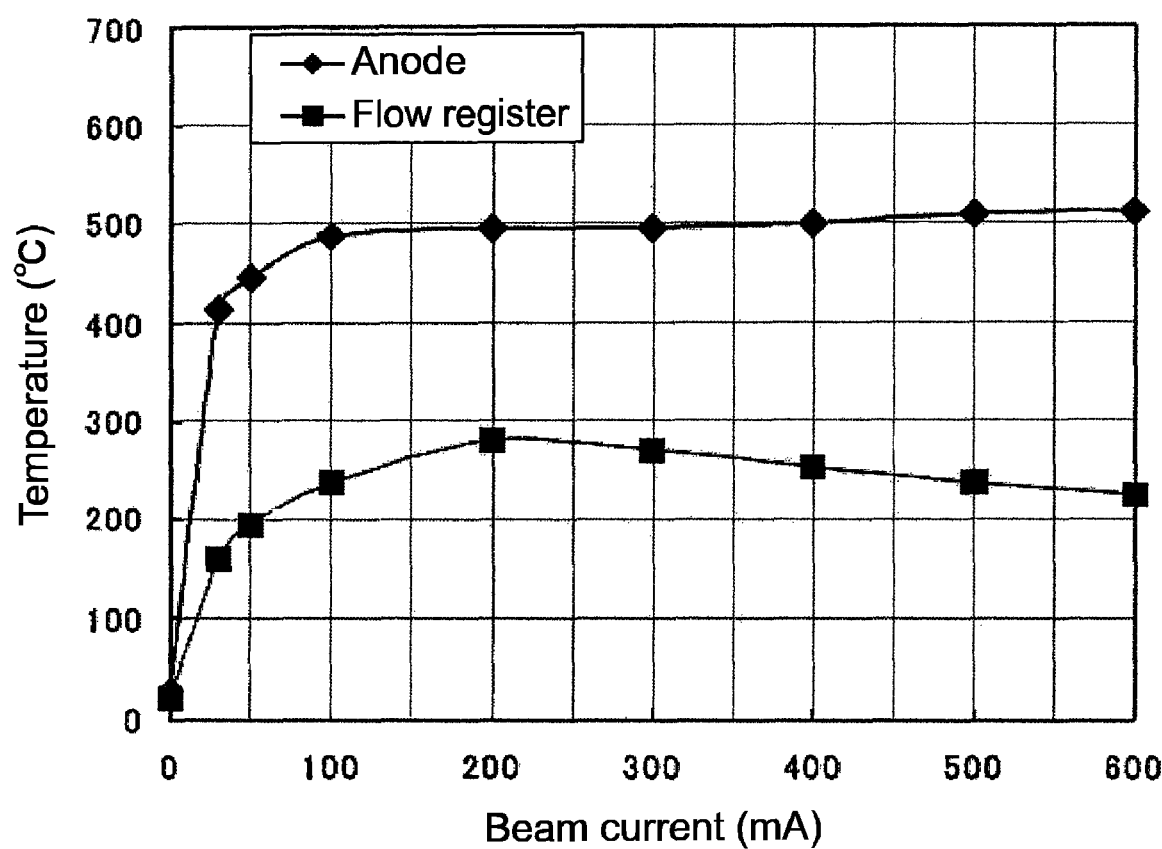
FIG. 8 is a graph of the beam current and temperatures at the anode and the flow register for comparison. This is a diagram in the case where control of the rotation speed of the turbo molecular pump 51 (FIG. 1) is not performed. The temperature of the flow register decreases as the beam current increases.
Figure 9:
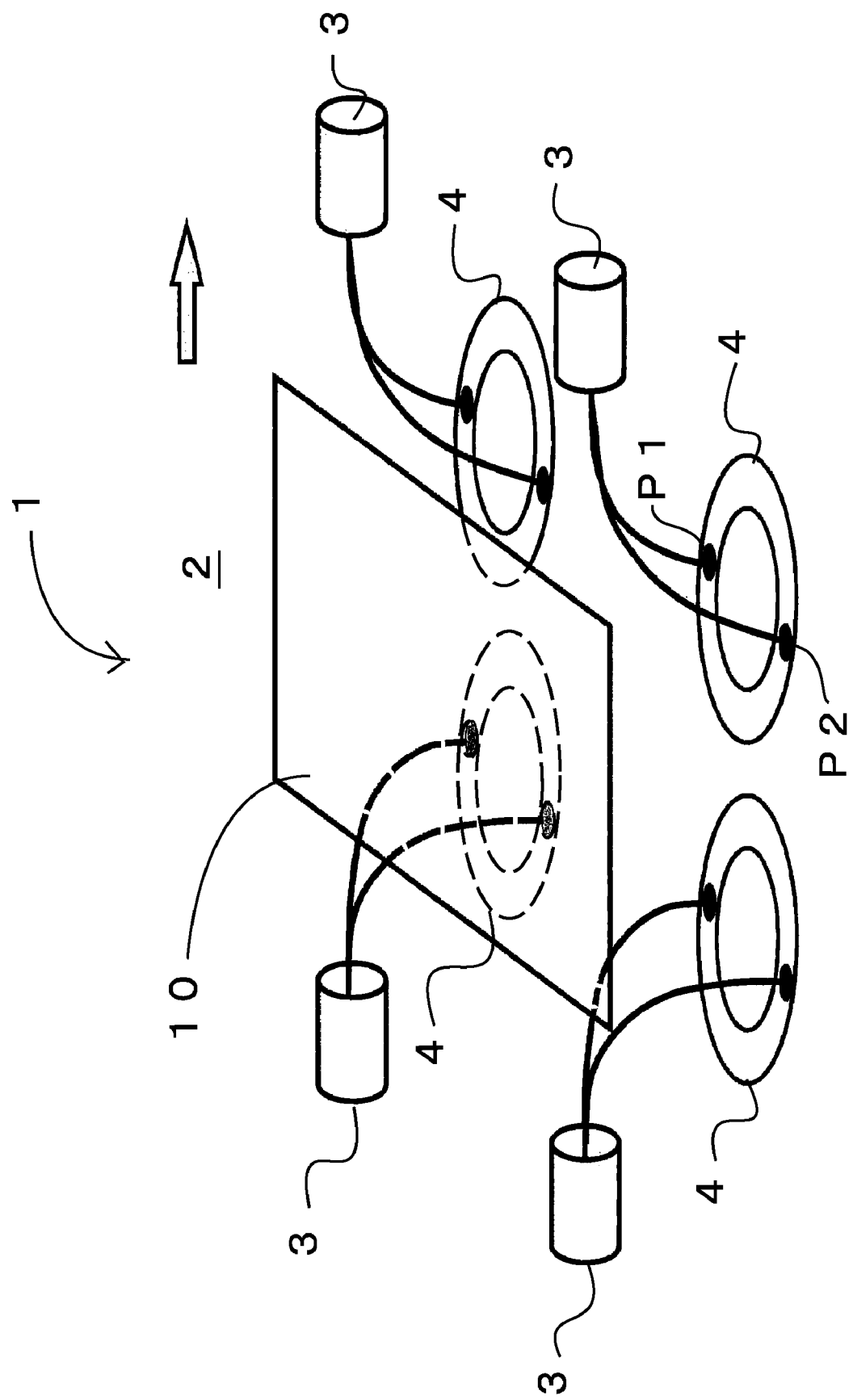
FIG. 9 is a schematic diagram of an MgO vapor deposition apparatus. In this example, four pierce-type electron guns 3 are provided for four ring hearths 4. Jumping control is performed, in which an electron beam is alternately focused onto two irradiation points P on a ring hearth by controlling a deflection coil. It should be noted that an arrow in the figure indicates a traveling direction of the glass substrate 10. Further, the ring hearth that is positioned below the glass substrate 10 is indicated by dotted lines.
Figure 10:
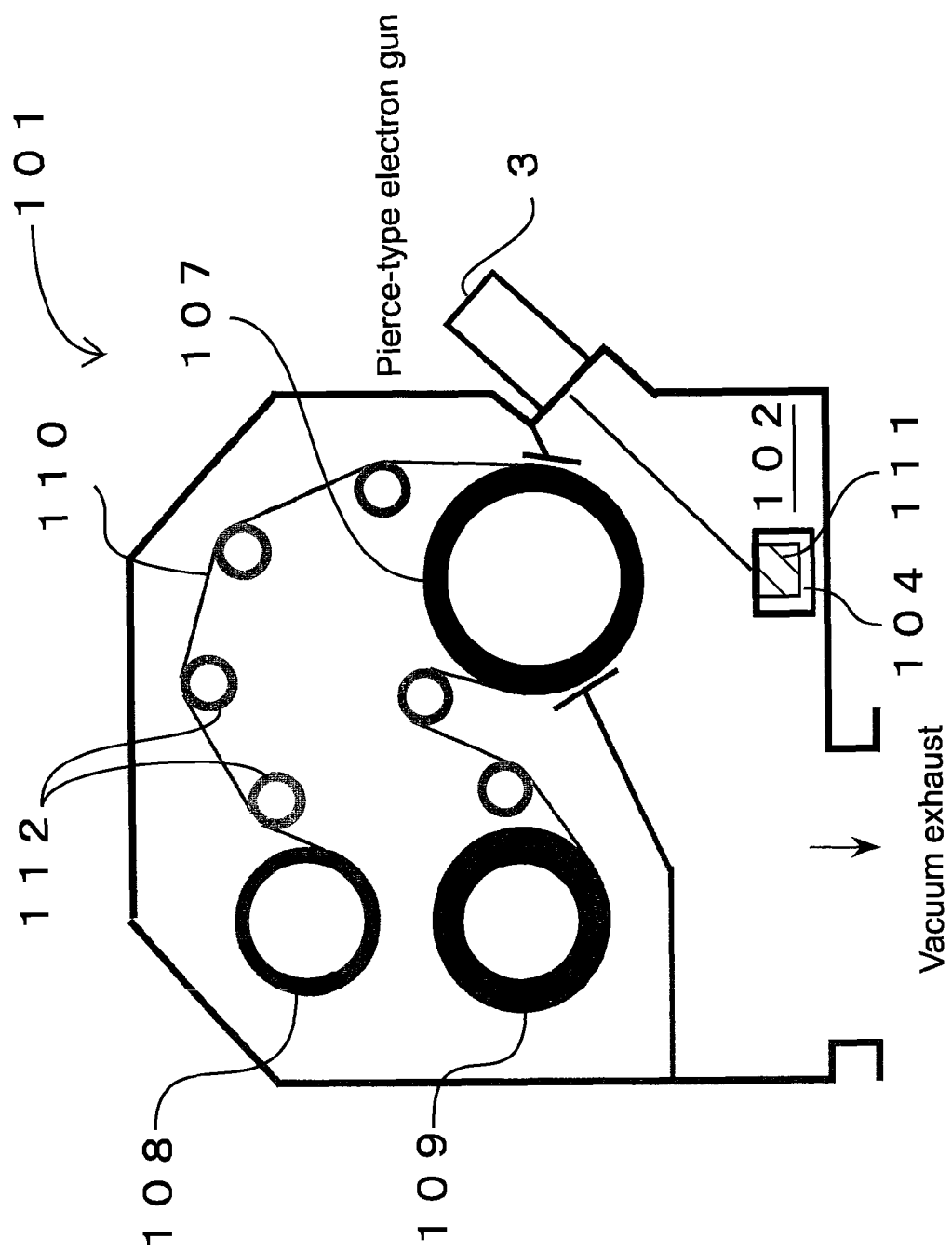
FIG. 10 is a schematic diagram of a roll-to-roll type vapor deposition apparatus. An electron beam is irradiated onto a vapor deposition material in a vapor deposition material container 104 to evaporate the vapor deposition material. When a tape base material 110 fed from an unwinding roll 108 wraps around a main roller 107, the main roller is exposed to a vapor of the material that is evaporated from the vapor deposition material container 104 placed below, and a deposition layer is formed on its surface. The tape base material on which the deposition layer is formed is wound by a winding reel 109. The apparatus thus performs continuous deposition.
Figure 11:
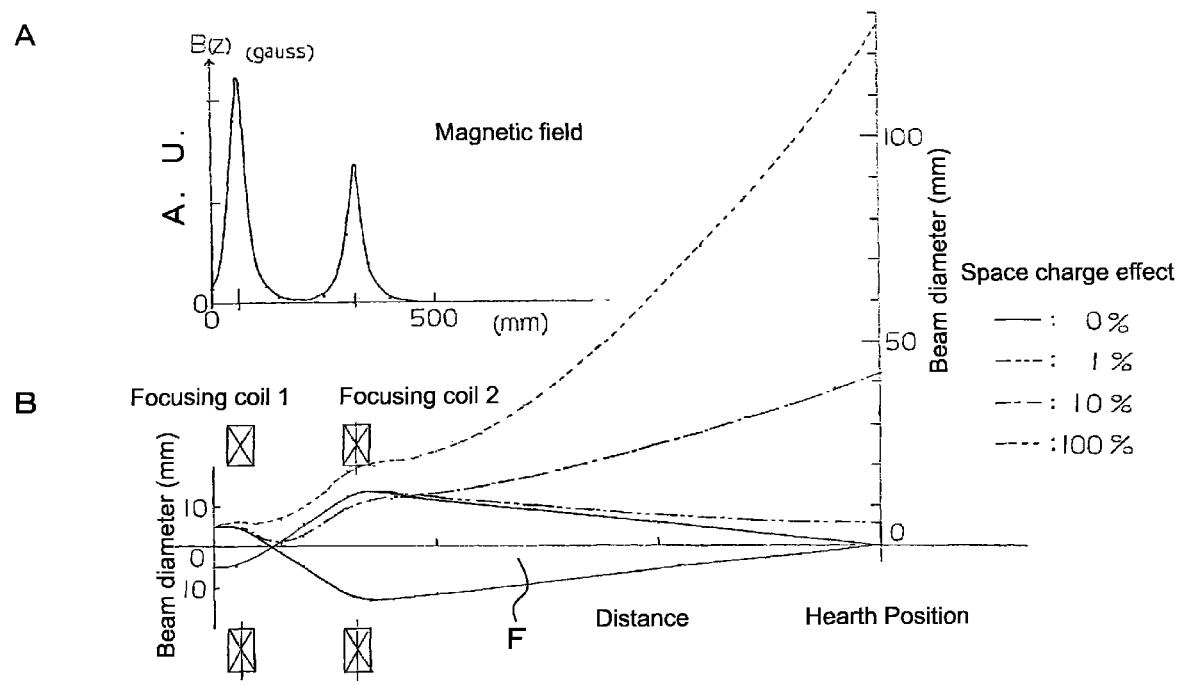
FIG. 11 is a diagram illustrating increase in a diameter of a cylindrical electron beam due to a space charge effect.

For comparison, a measurement result of the beam current and the temperatures of the anode 39 and the flow register 43 in the case where there is no feedback is shown in FIG. 8. When the beam current increases, the temperature of the anode 39 is constant whereas the temperature of the flow register 43 tends to decrease. This is because the beam is focused due to a space charge neutralizing action. That is, the result shows that the beam diameter at the internal of the electron gun has changed because there is no feedback.

As described above, it can be seen that good control becomes possible according to the present invention.

(Embodiment 2)

Figure 13:
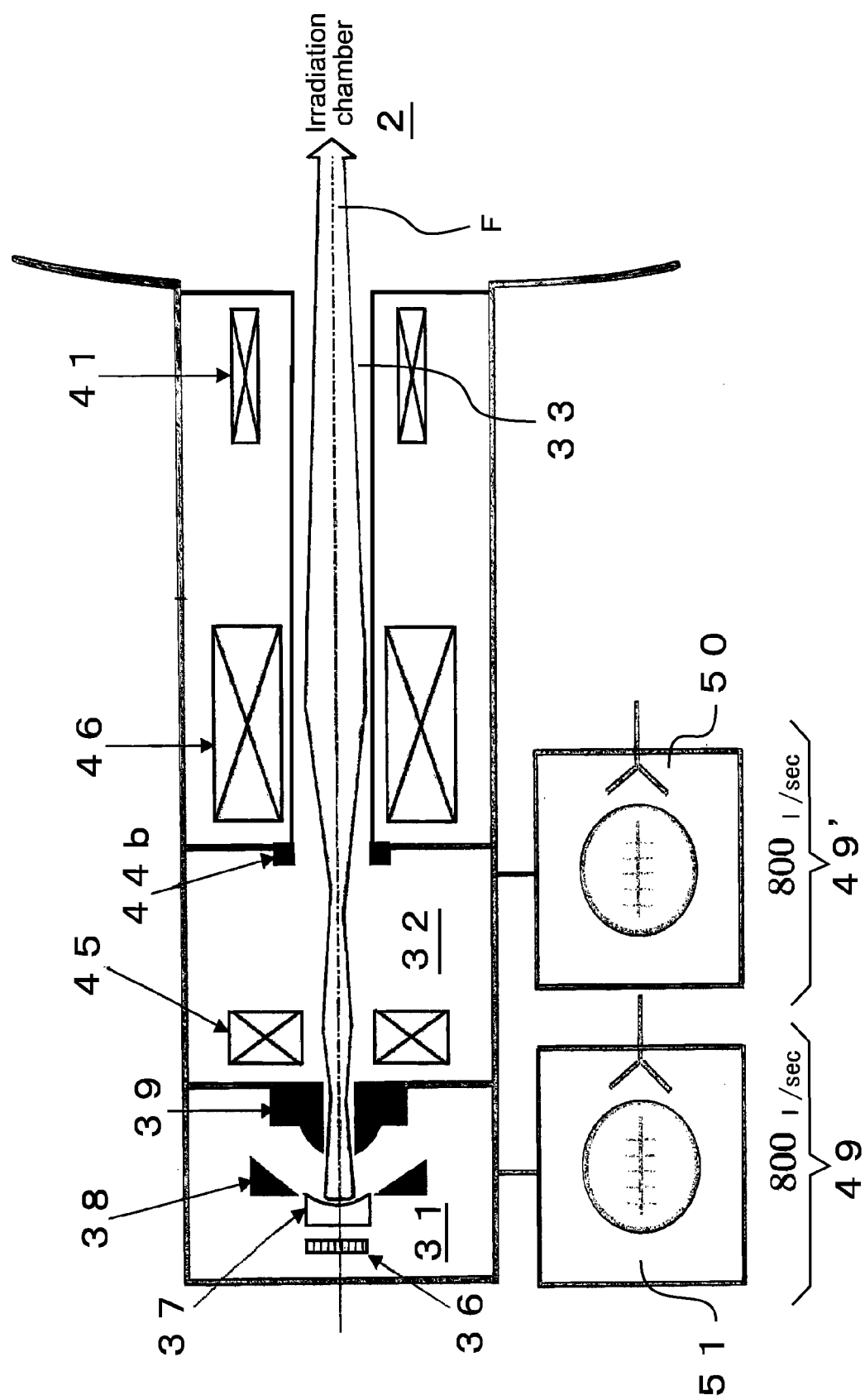
FIG. 13 is a diagram illustrating a state of beam expansion at the internal of the electron gun. It should be noted that an aperture 44b, which is an auxiliary member for pressure controlling, is provided at the differential exhaust hole.
Figure 14:
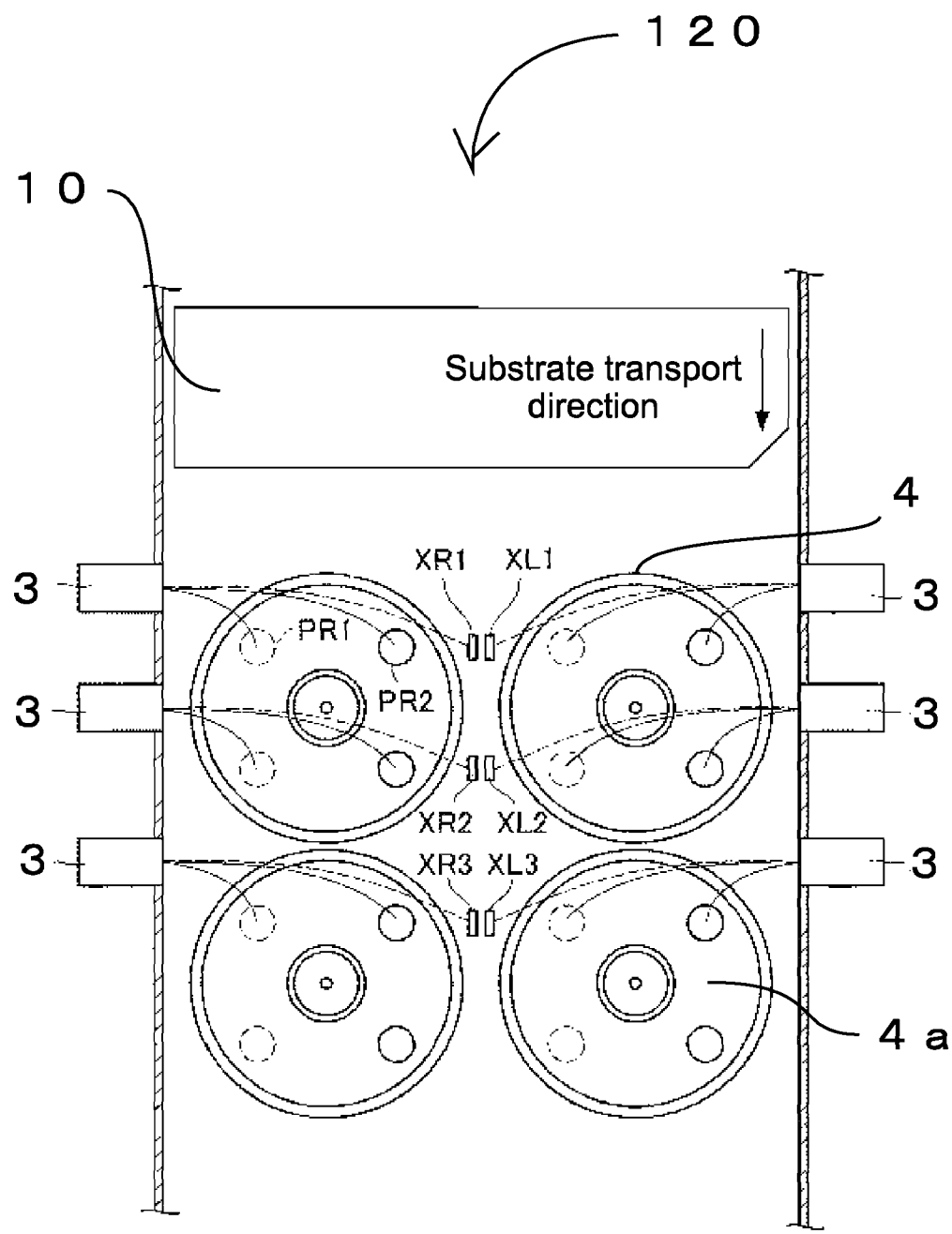
FIG. 14 is an example of a method for controlling a conventional in-line electron beam vapor deposition apparatus.

Next, using FIGS. 3, 4 and 13, a description will be given on an embodiment of a 100 kW electron gun having a second focusing coil, a second flow register and a differential exhaust system. It should be noted that the vacuum exhaust system and the differential exhaust system, which are not shown in FIG. 4, are assumed to be connected with an exhaust port 64 and an exhaust port 65, respectively.

It is desirable that a location where temperature measurement by a thermocouple is performed is a thermocouple R4 of a ring 74a provided on an outlet side of a first flow register 73a of an intermediate chamber 62 in FIG. 4 or a thermocouple R5 of a ring 74b provided at an inlet of a second flow register 73b. Alternatively, a thermocouple R2 of the first flow register 73a or a thermocouple R6 of the second flow register 73b may be used. It should be noted that the ring 74a and the ring 74b are auxiliary members for pressure adjustment, which are provided in the flow register. Further, a differential exhaust pipe 44b in FIG. 3 and an aperture 44b are auxiliary members for pressure adjustment, which are provided in the intermediate chamber 32.

With this structure, the same effect as that of the embodiment 1 is obtained.

The embodiment of the present invention is described above. The present invention is not of course limited to those, and can be variously modified based on the technical idea of the present invention.

For example, the present invention may be applied to a vacuum apparatus having a different structure. Moreover, the present invention may be used in combination with another electron beam stabilization means.

Further, in the embodiments, the turbo molecular pumps 50, 51 that are capable of changing the exhaust rate by controlling the rotation speed are used for pressure control at the internal of the electron gun, but a conductance valve 56 (FIGS. 1 and 3) may be used. Examples of a control method of the conductance include a conductance valve such as a butterfly type, which is typically used, a gate type, and an iris type (camera aperture type).

In addition, in the case where an inert gas such as Ar does not have any problem in the process, the measurement result at the internal of the electron gun may be fed back to a gas flow. By combining a plurality of methods such as a method of feeding back the temperature measurement result at the internal of the electron gun to the gas flow, a method of feeding back to a conductance, a method of feeding back to a introduction amount of a space charge neutralizing gas, and a method of feeding back the temperature measurement result to pressure at the internal of the irradiation chamber 2 and pressure at the internal of the electron gun, it is possible to provide a highly stable evaporation system.

Figure 12:
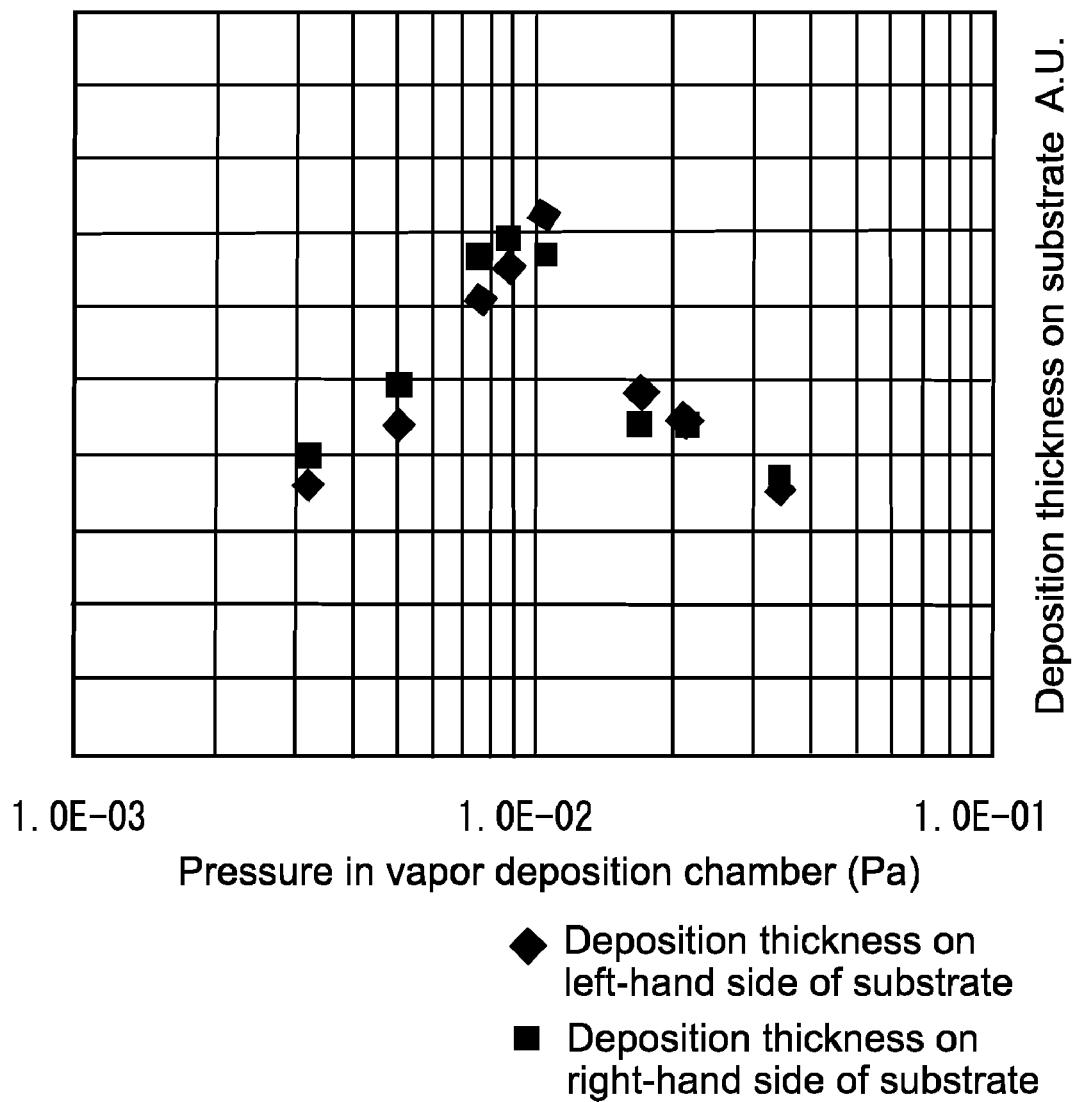
FIG. 12 is a diagram illustrating a relationship between a vapor deposition pressure and a deposition rate. In this example, the deposition rate is highest at the vapor deposition pressure 1.0 E-02 Pa. At the vapor deposition pressure 3.0 E-03 Pa, the deposition rate is decreased because the diameter of the electron beam expands, the power density decreases, and amount of the electrons that reach the vapor deposition material decreases due to an influence of the space charge effect. At the vapor deposition pressure 3.0 E-02 Pa, the deposition rate is decreased, because a collision with the electron beam and the evaporated material is caused due to increase of particles in the atmosphere.

Moreover, considering, in addition to the space charge in the irradiation chamber 2, expansion of electrons caused by collision with particles in the atmosphere, the temperature may not be simply constant, but may be controlled to an appropriate temperature which is preset such that a beam aperture corresponds to the pressure at the internal of the irradiation chamber 2 in order to obtain an optimum beam irradiation amount in the irradiation chamber 2. For example, as a deposition example shown is FIG. 12, a deposition rate is highest at a vapor deposition pressure 1.0 E-02 Pa. At the vapor deposition pressure 3.0 E-03 Pa, the diameter of the electron beam increases and the power density decreases and the deposition rate decreases due to an influence of the space charge effect. On the other hand, at 3.0 E-02 Pa, the deposition rate decreases because of collision with the electron beam and evaporated materials due to increase of particles in the atmosphere. It is shown that the vapor deposition pressure 1.0 E-02 Pa is appropriate in this electron beam irradiation amount.

Further, it is more effective to use, in addition to the method shown in the embodiments, a method for directly monitoring the diameter of the electron beam and a method for electrically monitoring a beam condition.

Moreover, the present invention may be applied to not only Mgo vapor deposition, but also a vapor deposition apparatus that uses a pierce-type electron gun.

In addition, in the in-line electron beam vapor deposition apparatus in the embodiments, the ring hearth is used as a container for storing a vapor deposition material, but a crucible may be used.

Moreover, it is possible to use the present invention not only as a method for forming an MgO layer, but also as a method for forming a metal oxide layer such as a $SiO_2$ layer and a $TiO_2$ layer. Further, the method for forming a vapor deposition layer according to the present invention may be used as a method for forming a metal oxide layer such as an Al layer.

What is claimed is:

1. A method of controlling a pierce-type electron gun, comprising:
    directly measuring temperature at an internal portion of the pierce-type electron gun; and feeding a measurement result of the temperature back to an exhaust rate of a vacuum exhaust system by any one of:
   changing a rotation speed of a pump of the vacuum exhaust system, and
   changing a gas flow amount of the vacuum exhaust system.

2. The method of controlling the pierce-type electron gun according to claim 1, wherein a thermocouple is used for measuring the temperature.

3. The method of controlling the pierce-type electron gun according to claim 1, wherein the step of measuring the temperature is measuring temperatures of any one of an anode and a flow register.

4. The method of controlling the pierce-type electron gun according to claim 1, wherein the step of measuring the temperature is measuring a temperature of any one of a ring, an aperture, and an exhaust pipe provided at an inlet or an outlet of any one of a cathode chamber, an intermediate chamber, and a scanning chamber.

5. The method of controlling the pierce-type electron gun according to claim 1, wherein the pierce-type electron gun is a an electron gun having two or more focusing coils, and an electron beam is controlled so as to enter approximately parallelly from a focusing coil of a previous stage to a coil of a next stage.

6. An apparatus for controlling a pierce-type electron gun, comprising:
   means for performing direct measurement of temperature at an internal portion of the pierce-type electron gun; and
   means for performing feedback of a measurement result of the temperature at the internal portion of the pierce-type electron gun to an exhaust rate of a vacuum exhaust system by any one of:
      changing a rotation speed of a pump of the vacuum exhaust system; and
      changing a gas flow amount of the vacuum exhaust system.

7. The apparatus for controlling the pierce-type electron gun according to claim 6, wherein the means for performing direct measurement is a thermocouple.

8. The apparatus for controlling the pierce-type electron gun according to claim 6, wherein locations where the means for performing direct measurement is provided are an anode and a flow register.

9. The apparatus for controlling the pierce-type electron gun according to claim 6, wherein a location where the means for performing direct measurement is any one of a ring, an aperture, and an exhaust pipe provided at an outlet or an inlet of any one of a cathode chamber, an intermediate chamber, and a scanning chamber.

10. The apparatus for controlling the pierce-type electron gun according to claim 6, wherein the pierce-type electron gun is an electron gun having two or more focusing coils, and the apparatus for controlling the pierce-type electron gun comprises means for controlling an electron beam so as to enter approximately horizontally from a focusing coil of a previous stage to a focusing coil of a next stage.

* * * * *